United States Patent
Curtis

(10) Patent No.: US 9,542,009 B2
(45) Date of Patent: Jan. 10, 2017

(54) KNOB BASED GESTURE SYSTEM

(71) Applicant: Microchip Technology Incorporated, Chandler, AZ (US)

(72) Inventor: Keith Edwin Curtis, Gilbert, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 373 days.

(21) Appl. No.: 13/839,883

(22) Filed: Mar. 15, 2013

(65) Prior Publication Data

US 2014/0267039 A1    Sep. 18, 2014

(51) Int. Cl.
| | | |
|---|---|---|
| G06F 3/0338 | (2013.01) | |
| G06F 3/044 | (2006.01) | |
| G06F 3/0362 | (2013.01) | |
| H03K 17/96 | (2006.01) | |
| H03K 17/98 | (2006.01) | |

(52) U.S. Cl.
CPC .......... *G06F 3/0338* (2013.01); *G06F 3/0362* (2013.01); *G06F 3/044* (2013.01); *H03K 17/9622* (2013.01); *H03K 17/98* (2013.01); *H03K 2217/96031* (2013.01); *H03K 2217/96066* (2013.01)

(58) Field of Classification Search
CPC ...... G06F 3/0338; G06F 3/0362; G06F 3/044; G06F 3/033; H03K 17/9622; H03K 17/98; H03K 2217/96031; H03K 2217/96066
See application file for complete search history.

(56) References Cited

U.S. PATENT DOCUMENTS

| | | | | |
|---|---|---|---|---|
| 5,421,694 A | * | 6/1995 | Baker et al. | ............... 414/694 |
| 5,576,704 A | * | 11/1996 | Baker et al. | ................. 341/20 |
| 5,675,309 A | * | 10/1997 | DeVolpi | ............. G05G 9/047 |
| | | | | 200/6 A |
| 7,124,041 B1 | * | 10/2006 | Johnson | ............ G05B 9/02 |
| | | | | 324/140 R |
| 8,643,626 B2 | * | 2/2014 | Philipp | .................... 345/174 |
| 8,648,804 B1 | * | 2/2014 | Roberts | .................... 345/161 |

(Continued)

OTHER PUBLICATIONS

International Search Report and Written Opinion, Application No. PCT/US2014/019898, 15 pages, Sep. 1, 2014.

*Primary Examiner* — Kumar Patel
*Assistant Examiner* — Sejoon Ahn
(74) *Attorney, Agent, or Firm* — Slayden Grubert Beard PLLC

(57) ABSTRACT

A knob or joystick apparatus detects gesture based actions of a user's fingers and/or hand. A user grasps the knob or joystick and moves the knob or joystick in either rotational direction, e.g., clockwise or counter clockwise, moves the knob or joystick horizontally/vertically or any combination thereof, and/or presses or pulls the knob or joystick in or out. Capacitive sensors are used in combination with a digital device, e.g., microcontroller, for detecting, decoding and interpreting therefrom various gesturing movements. A user may grasp a knob and either moves his/her fingers in a rotational, horizontal/vertical, and/or in/out movement(s) along an axis of the knob. During the motion(s) of the user's fingers, portions of an outer covering of the knob are deflected inwards toward capacitive sensors, wherein the movement(s) of the deflected portion(s) of the outer covering are detected, decoded and interpretations are made therefrom of various gesturing movements.

3 Claims, 11 Drawing Sheets

(56) References Cited

U.S. PATENT DOCUMENTS

| | | |
|---|---|---|
| 8,711,093 B2* | 4/2014 | Ong et al. .................... 345/158 |
| 8,797,048 B2* | 8/2014 | Held et al. ................... 324/662 |
| 2004/0000189 A1* | 1/2004 | Proksch .............. G01Q 10/065 |
| | | 73/105 |
| 2005/0231476 A1* | 10/2005 | Armstrong ................... 345/161 |
| 2006/0238505 A1* | 10/2006 | Ahlgren et al. ............. 345/161 |
| 2006/0274040 A1* | 12/2006 | Passaro ................. G05G 9/047 |
| | | 345/161 |
| 2007/0126700 A1* | 6/2007 | Wright .......................... 345/161 |
| 2008/0164854 A1* | 7/2008 | Lys .................... H05B 33/0824 |
| | | 323/226 |
| 2009/0009491 A1 | 1/2009 | Grivna .......................... 345/184 |
| 2010/0126784 A1* | 5/2010 | Suddreth ................ G06F 3/016 |
| | | 178/18.01 |
| 2010/0259481 A1* | 10/2010 | Oh ................................ 345/163 |
| 2012/0019449 A1 | 1/2012 | Yilmaz et al. ................ 345/173 |

* cited by examiner

Figure 1 (Prior Technology)

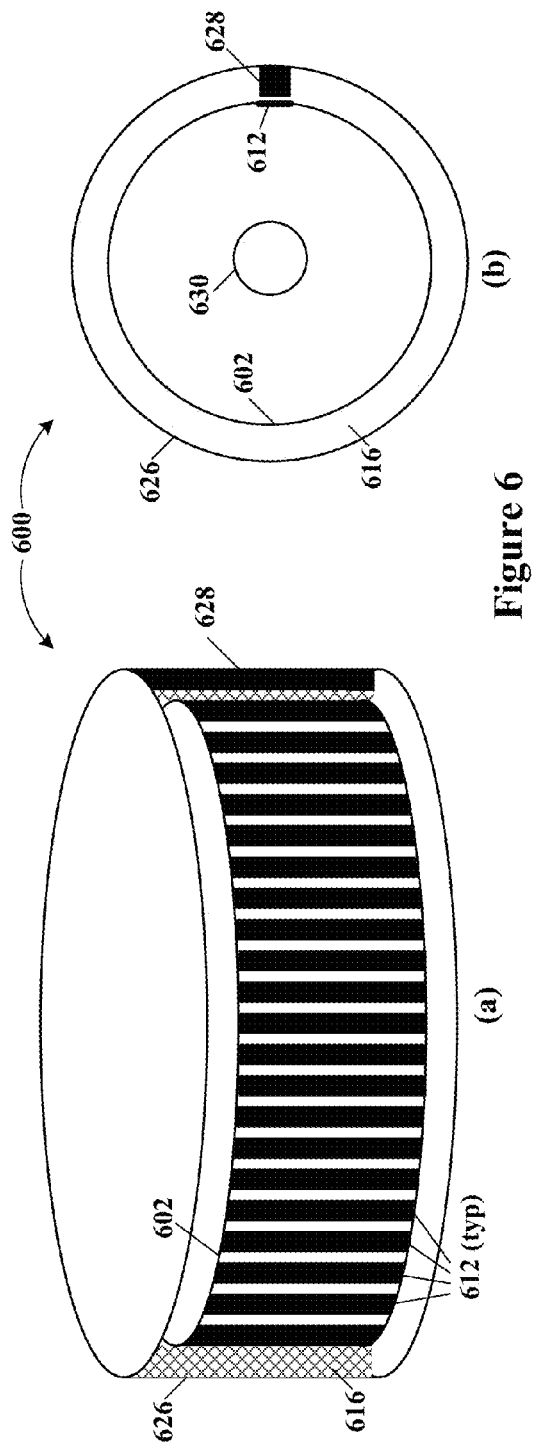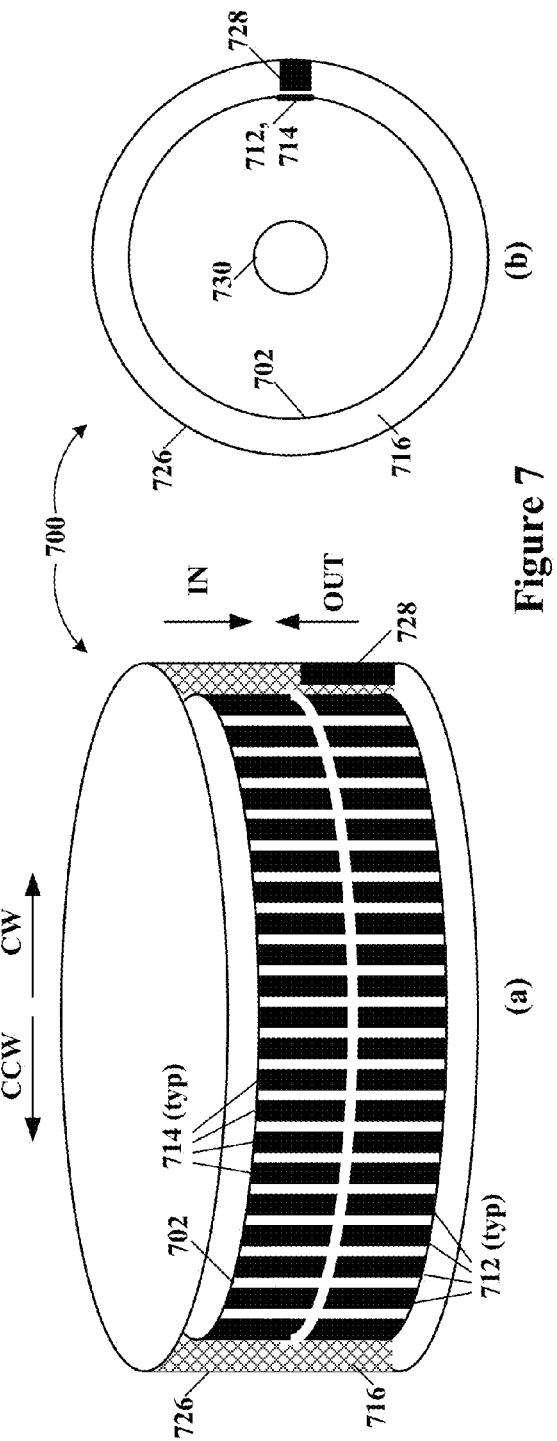
Figure 6
Figure 7

KNOB BASED GESTURE SYSTEM

TECHNICAL FIELD

The present disclosure relates to a knob based gesture system, e.g., a knob that rotates about an axis and/or can be pushed in or pulled out, or simulations thereof; and more particularly, to a knob based gesture system that uses capacitive touch sensors that require physical force on the touch sensor(s) during gesturing motions and further shields the capacitive touch sensors from extraneous unwanted activation by inadvertent proximity of a user.

BACKGROUND

Capacitive touch sensors are used as a user interface to electronic equipment, e.g., calculators, telephones, cash registers, gasoline pumps, etc. The capacitive touch sensors are activated (controls a signal indicating activation) by a change in capacitance of the capacitive touch sensor when an object, e.g., user finger tip, causes the capacitance thereof to change. Referring to FIG. 1, depicted is a prior technology capacitive touch sensor generally represented by the numeral 100. The prior technology capacitive touch sensor 100 comprises a substrate 102, a sensor element 112 and a protective covering 108, e.g., glass. When a user finger tip 110 comes in close proximity to the sensor element 112, the capacitance value of the sensor element 112 changes. This capacitance change is electronically processed (not shown) so as to generate a signal indicating activation of the capacitive touch sensor 100 by the user (only finger tip 110 thereof shown). The protective covering 108 may be used to protect the sensor element 112 and for marking of the sensor 100.

Problems exist with proper operation of the sensors 100 that may be caused by water, oil, mud, and/or food products, e.g., ketchup and mustard, either false triggering activation or inhibiting a desired activation thereof. Also problems exist when metallic objects (not shown) come in near proximity of the sensor element 112 and cause an undesired activation thereof. When there are a plurality of sensors 100 arranged in close proximity to each other, e.g., circumference and/or top of a knob arrangement, activation of the intended ones of the sensors 100 may cause unintended ones of neighbor sensor(s) 100 to undesirably actuate because of the close proximity of the user finger tip 110, or other portion of the user hand (not shown). This activation of unintended ones of the neighbor sensor(s) 100 may be caused when touching the intended ones of the sensors 100 and a portion of the user's hand also is sufficiently close to the unintended ones of the sensor(s) 100 for activation thereof.

SUMMARY

The aforementioned problems are solved, and other and further benefits achieved by the capacitive touch sensors disclosed herein.

According to an embodiment, a knob based gesture interface may comprise: a curved substrate; a first plurality of capacitive sensor elements disposed on a face of the curved substrate; a deformable electrically insulated space surrounding the first plurality of capacitive sensor elements and the curved substrate; and an electrically conductive and mechanically deformable curved plane surrounding the deformable electrically insulated space, the first plurality of capacitive sensor elements and the curved substrate; wherein when at least one mechanical force may be applied to at least one location on the electrically conductive and mechanically deformable curved plane the at least one mechanical force causes that at least one location on the plane to be biased toward at least one of the first plurality of capacitive sensor elements, whereby the at least one of the first plurality of capacitive sensor elements changes capacitance value.

According to a further embodiment, the electrically conductive and mechanically deformable curved plane may be knob shaped. According to a further embodiment, a second plurality of capacitive sensor elements may be disposed on the face of the curved substrate and on the same plane thereof as the first plurality of capacitive sensor elements; the deformable electrically insulated space may surround the first and second plurality of capacitive sensor elements and the curved substrate; and the electrically conductive and mechanically deformable curved plane may surround the deformable electrically insulated space, the first and second plurality of capacitive sensor elements and the curved substrate; wherein when at least one mechanical force may be applied to at least one location on the electrically conductive and mechanically deformable curved plane the at least one mechanical force causes that at least one location on the plane may be biased toward at least one of the first and/or second plurality of capacitive sensor elements, whereby the at least one of the first and/or second plurality of capacitive sensor elements may change capacitance value.

According to a further embodiment, when a plurality of mechanical forces may be applied to a plurality of locations on the electrically conductive and mechanically deformable curved plane the plurality of mechanical forces cause those locations of the plane to be biased toward respective ones of the first plurality of capacitive sensor elements, whereby the respective ones of the first plurality of capacitive sensor elements change capacitance values. According to a further embodiment, when a plurality of mechanical forces may be applied to the electrically conductive and mechanically deformable curved plane that cause it to be biased toward respective ones of the first and/or second plurality of capacitive sensor elements, the respective ones of the first and/or second plurality of capacitive sensor elements change capacitance values. According to a further embodiment, sequential changes in the capacitance values of the respective ones of the first plurality of capacitive sensor elements may determine a direction of the plurality of mechanical forces applied to the electrically conductive and mechanically deformable curved plane. According to a further embodiment, the direction may be a rotational direction.

According to a further embodiment, sequential changes in the capacitance values of the respective ones of the first and/or second plurality of capacitive sensor elements may determine at least one direction of the plurality of mechanical forces applied to the electrically conductive and mechanically deformable curved plane. According to a further embodiment, the at least one direction may be a rotational direction. According to a further embodiment, the at least one direction may be a linear direction.

According to a further embodiment, a third plurality of capacitive sensor elements may be disposed on another face of the curved substrate substantially perpendicular to the face thereof; the deformable electrically insulated space may further surround the third plurality of capacitive sensor elements and the another face of the curved substrate; and the electrically conductive and mechanically deformable curved plane may surround the deformable electrically insulated space, the third plurality of capacitive sensor elements and the another face of the curved substrate; wherein when a mechanical force may be applied to at least one location on the electrically conductive and mechanically deformable curved plane the at least one mechanical force may cause that at least one location on the plane to be biased toward at least one of the third plurality of capacitive sensor elements, whereby the at least one of the third plurality of capacitive sensor elements may change capacitance value.

According to a further embodiment, sequential changes in the capacitance values of the respective ones of the third plurality of capacitive sensor elements may determine a direction of the mechanical force applied to the electrically conductive and mechanically deformable curved plane.

According to another embodiment, a knob based interface may comprise: a curved substrate; a first plurality of capacitive sensor elements disposed on a face of the curved substrate; an electrically insulated space surrounding the first plurality of capacitive sensor elements and the curved substrate; an electrically conductive curved plane surrounding the electrically insulated space, the first plurality of capacitive sensor elements and the curved substrate; and a target electrically and mechanically coupled to an inside face of the electrically conductive curved plane, wherein the target and electrically conductive curved plane may be adapted to rotate around the first plurality of capacitive sensor elements; wherein when the electrically conductive curved plane and target may be rotated around the first plurality of capacitive sensor elements, the target may be proximate to at least one of the first plurality of capacitive sensor elements, whereby the at least one of the first plurality of capacitive sensor elements changes capacitance value.

According to a further embodiment, a second plurality of capacitive sensor elements may be disposed on the face of the curved substrate and on the same plane thereof as the first plurality of capacitive sensor elements; the electrically insulated space may surround the first and second plurality of capacitive sensor elements and the curved substrate; and the electrically conductive curved plane may surround the electrically insulated space, the first and second plurality of capacitive sensor elements and the curved substrate; wherein when the electrically conductive curved plane and target move substantially perpendicular to a plane of rotation thereof, the target may be proximate to at least one of the first and/or second plurality of capacitive sensor elements, the at least one of the first and/or second plurality of capacitive sensor elements changes at least one capacitance value.

According to a further embodiment, the at least one first plurality of capacitive sensor elements having the capacitance value change may indicate a rotation position of the electrically conductive curved plane. According to a further embodiment, the at least one first and/or second plurality of capacitive sensor elements having the at least one capacitance value change may indicate a rotation position of the electrically conductive curved plane and a position thereof perpendicular to the rotation position.

According to a further embodiment, an information display may be disposed on another face of the curved substrate substantially perpendicular to the face thereof. According to a further embodiment, the information display may be an alpha-numeric display. According to a further embodiment, the information display may be plurality of light emitting diodes (LEDs) located around a circumference of the another face of the curved substrate, wherein at least one of the plurality of light emitting diodes may indicate a rotation position of the curved substrate.

According to yet another embodiment, a gesturing apparatus may comprise: a base; a pivot means rotationally attached to the base; a shaft having a first end coupled to the pivot means; a first target attached at a location of the shaft toward the first end thereof; a second target attached to and may be disposed around the shaft toward a second end thereof; a first plurality of capacitive sensor elements disposed around the shaft toward to the first end thereof; and a second plurality of capacitive sensor elements disposed around the shaft toward to the second end thereof; wherein when the shaft may be rotated substantially perpendicular to the base, the first target may be proximate to at least one of the first plurality of capacitive sensor elements, whereby the at least one of the first plurality of capacitive sensor elements changes capacitance value that may be used in determining rotation position of the shaft; and wherein when the shaft may be tilted away from being substantially perpendicular to the base, the second target may be closer to at least one of the second plurality of capacitive sensor elements, whereby the at least one of the second plurality of capacitive sensor elements changes capacitance value that may be used in determining tilt position of the shaft.

According to a further embodiment, a third plurality of capacitive sensor elements may be disposed around the shaft and located between the first and second plurality of capacitive sensor elements; a positioning means may allow motion of the shaft toward or away from the base, wherein the first target may be proximate to at least one of the first and/or third plurality of capacitive sensor elements, whereby the at least one of the first and/or third plurality of capacitive sensor elements may change capacitance value that may be used in determining rotation position of the shaft and position toward or away from the base. According to a further embodiment, a knob may be attached to the second end of the shaft. According to a further embodiment, a control stick may be attached to the second end of the shaft.

BRIEF DESCRIPTION OF THE DRAWINGS

A more complete understanding of the present disclosure thereof may be acquired by referring to the following description taken in conjunction with the accompanying drawings wherein:

FIG. 6 illustrates schematic isometric cross section elevational and top views of a plurality of capacitive touch sensors arranged as a circular knob assembly, according to yet another specific example embodiment of this disclosure;

FIG. 7 illustrates schematic isometric cross section elevational and top views of a plurality of capacitive touch sensors arranged as a circular knob assembly, according to still another specific example embodiment of this disclosure;

Figure 1:
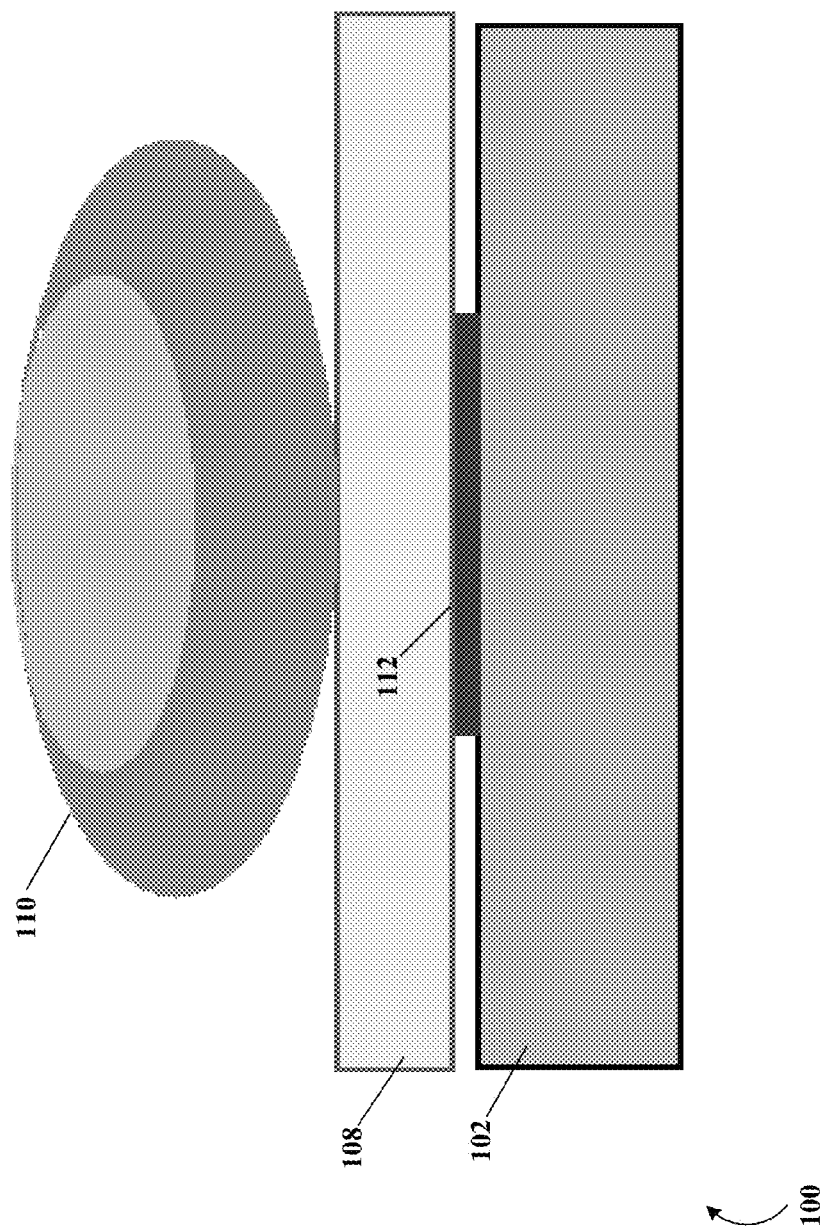
FIG. 1 is a schematic cross section elevational view of a prior technology capacitive touch sensor.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a knob or joystick apparatus may be used to detect gesture based actions of a user's fingers and/or hand. According to some embodiments described herein a user may grasp the knob or joystick and move the knob or joystick in either rotational direction, e.g., clockwise or counter clockwise, move the knob or joystick horizontally/vertically or any combination thereof, or depress/pull the knob or joystick in or out. Capacitive sensors may be used in combination with a digital device, e.g., microcontroller, for detecting, decoding and interpreting therefrom various gesturing movements. According to some other embodiments described herein a user grasps a knob and either moves his/her fingers in a rotational, horizontal/vertical, and/or in/out movement(s) along an axis of the knob. During the motion(s) of the user's fingers, portions of an outer covering of the knob are deflected inwards toward capacitive sensors, wherein the movement(s) of the deflected portion(s) of the outer covering are detected, decoded and interpretations are made therefrom of various gesturing movements.

Referring now to the drawings, the details of example embodiments are schematically illustrated. Like elements in the drawings will be represented by like numbers, and similar elements will be represented by like numbers with a different lower case letter suffix.

Figure 2:
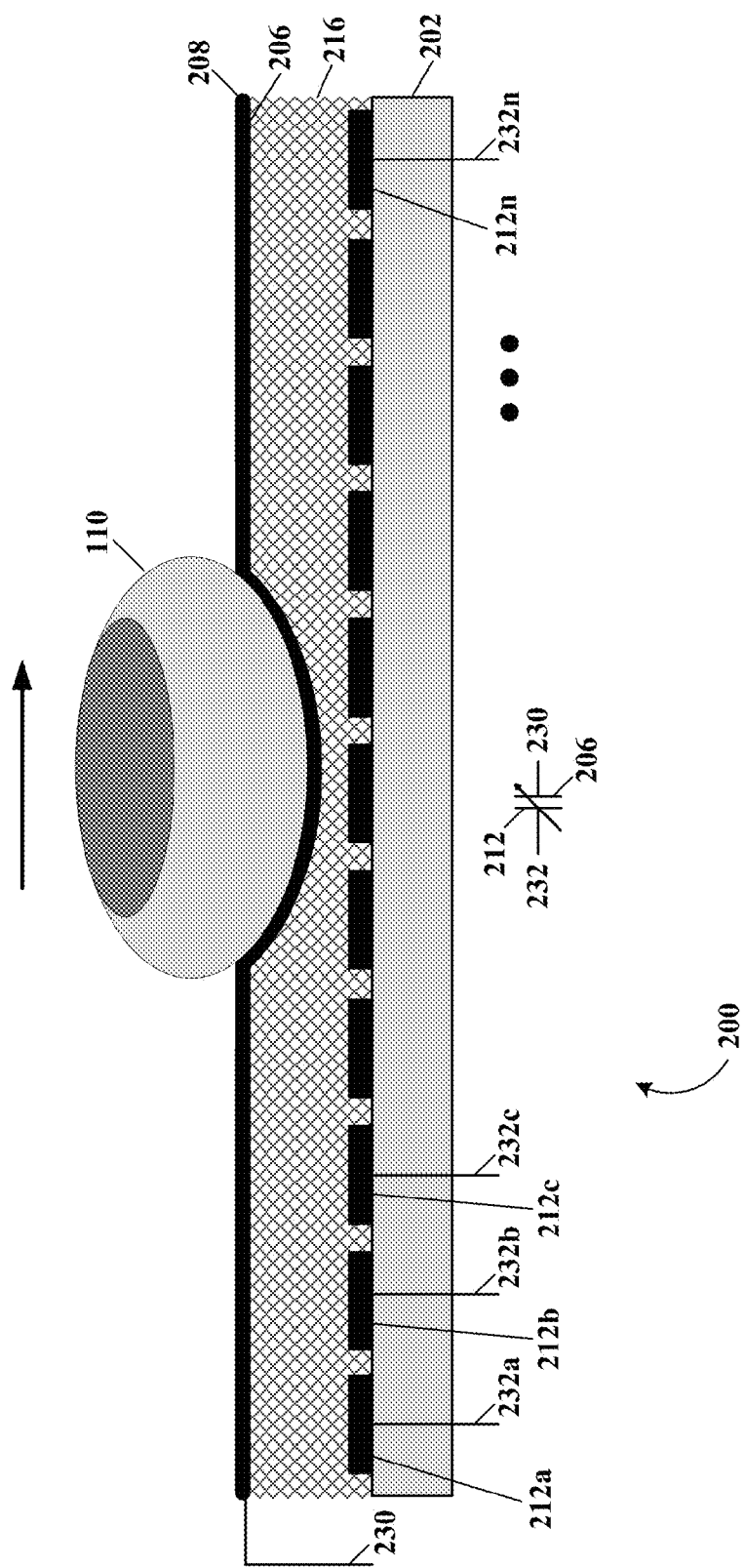
FIG. 2 is a schematic cross section elevational view of a plurality of capacitive touch sensors, according to specific example embodiments of this disclosure.

Referring to FIG. 2, depicted is a schematic cross section elevational view of a plurality of capacitive touch sensors, according to specific example embodiments of this disclosure. The capacitive touch sensors, generally represented by the numeral 200, may comprise a substrate 202, capacitive sensor elements 212, a deformable space 216, and an electrically conductive deformable plane 206. The conductive deformable plane 206 may be connected to a power supply common and/or grounded (not shown) to form a capacitor with each of the capacitive sensor elements 212, and for improved shielding of the capacitive sensor elements 212 from electrostatic disturbances and false triggering thereof. The deformable space 216 may be filled with, for example but not limited to, air, nitrogen, elastic silicon rubber, etc. An optional protective deformable cover 208 may be provided over the conductive deformable plane 206 and proximate to the deformable space 216.

Figure 3:
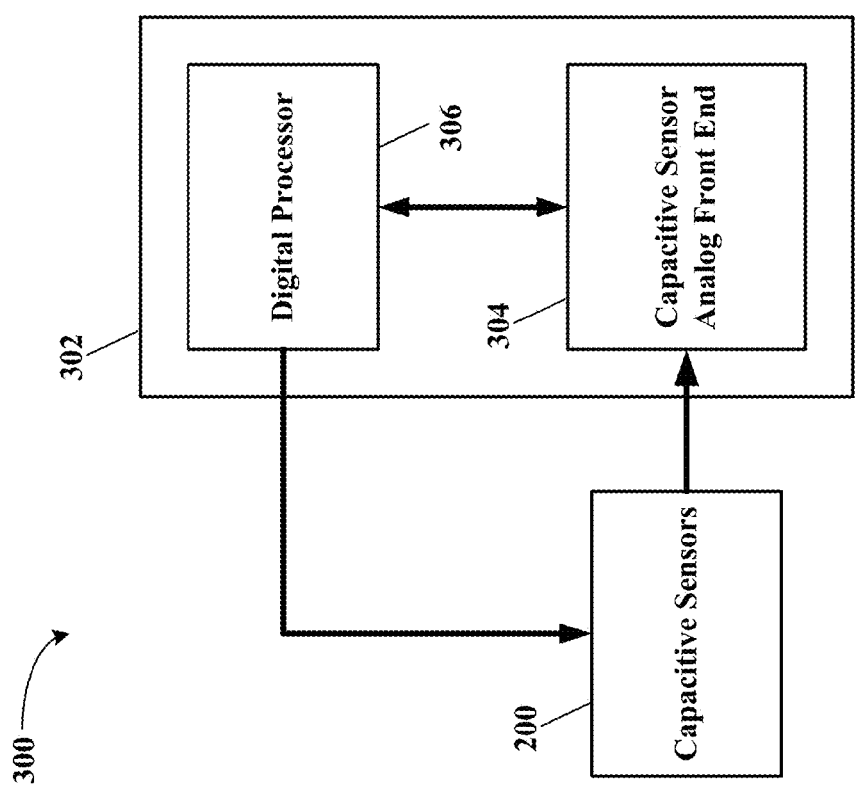
FIG. 3 is a schematic block diagram of a user interface having a plurality of capacitive touch sensors, according to the teachings of this disclosure.

Each of the capacitive sensor elements 212 may be connected through connections 232 to a capacitance measurement circuit, e.g., capacitive sensor analog front end (AFE) 304 (FIG. 3), and the conductive deformable plane 206 is normally connected through connection 230 to a power supply common and/or ground (not shown). However, the conductive deformable plane 206 may be connected through connection 230 to a digital output of a digital processor 306 (FIG. 3) and used as both one plate of the capacitor formed with the capacitive sensor element 212 when grounded. Or the conductive deformable plane 206 may be connected to a capacitive measurement input of the AFE 304 when the digital output from the digital processor 306 is in a high impedance off state. For example, the connection 230 is coupled to an input of the AFE 304 and the digital output is connected in parallel to the same input of the AFE 304. When the output is at a logic low, the conductive deformable plane 206 is at the power supply common, and when at a high impedance (off) the conductive deformable plane 206 may function as a capacitive sensor element similar to what is shown in FIG. 1. E.g., the digital output acts as a shunt switch that when closed shorts the conductive deformable plane 206 to ground and when open enables conductive deformable plane 206 to function as a capacitive sensor element 112 (e.g., see FIG. 1). This configuration for the conductive deformable plane 206 may be used as a proximity detector, e.g., as a user finger and/or hand approaches the capacitive sensor (conductive deformable plane 206) a "system wakeup" signal may be generated in the digital processor 306 (FIG. 3).

The conductive deformable plane 206 is physically deformable over the deformable space 216 so that when a force, e.g., a user's finger 110, presses down onto the conductive deformable plane 206, the distance between at least one of the capacitive sensor elements 212 and the conductive deformable plane 206 is reduced, thereby changing the capacitance of those at least one capacitive sensor elements 212. A capacitance change detection circuit (not shown) monitors the capacitance values of the capacitive sensor elements 212, and when any one or more of the capacitance values change (e.g., increases) a sensor activation signal may be generated (not shown). The conductive deformable plane 206 may be metal or other electrically conductive material, or the conductive deformable plane 206 may be plated, coated, attached, etc., to an inside face of the optional protective deformable cover 208.

The capacitive touch sensors 200 are substantially immune to false triggering caused by a user in close proximity to the sensor target because a correct area of the conductive deformable plane 206 must be deformed in order for the capacitance value of a capacitive sensor element 212 to change, e.g., requires an actuation force from the user's finger 110. In addition, stray metallic objects will not substantially affect the capacitance values of the capacitive sensor elements 212 for the same reason. Furthermore the assembly of the capacitive touch sensors 200 can be sealed within the physically deformable electrically insulated space 216 and thus may be substantially immune to fluid contamination thereof. As the user's finger 110 moves in a direction along the surface of the conductive deformable plane 206 the capacitance values of the capacitive sensor elements 212 proximate to the deformation of the conductive deformable plane 206 will change and locations and direction of the user's finger 110 may thereby be determined.

The capacitive sensor elements 212 are electrically conductive and may be comprised of metal such as, for example but not limited to, copper, aluminum, silver, gold, tin, and/or any combination thereof, plated or otherwise. The capacitive sensor elements 212 may also be comprised of non-metallic conductive material. The substrate 202 and capacitive sensor element 212 may be, for example but are not limited to, a curved printed circuit board having conductive (e.g., metal) areas etched thereon, a curved ceramic substrate with conductive areas thereon, clear or translucent glass or plastic with conductive areas thereon, etc.

Referring to FIG. 3, depicted is a schematic block diagram of a user interface having a plurality of capacitive touch sensors, according to the teachings of this disclosure. A plurality of capacitive touch sensors 200 may be arranged as shown in FIGS. 4-11 and as more fully described hereinafter. When a mechanical force is applied to at least one location on the conductive deformable plane 206, it will come closer to at least one of the capacitive sensor elements 212 proximate to the deformation in the conductive deformable plane 206 and will thereby change the capacitance value(s) of the at least one associated capacitive sensor 200, e.g., increase the capacitance value(s) thereof. This change in capacitance value(s) of the at least one associated capacitive sensor 200 may be detected by the AFE 304 and the digital processor 306 may read the output of the AFE 304 to determine which one(s) of the capacitive sensor(s) 200 has(ve) increased in capacitance value(s). The AFE 304 and digital processor 306 may be part of a digital device 302, e.g., microcontroller, application specific integrated circuit (ASIC), programmable logic array (PLA), etc. The digital processor 306 and AFE 304 may be part of a mixed signal (analog and digital circuits) integrated circuit device, e.g., mixed signal capable microcontroller.

The capacitive touch AFE 304 measures the capacitance value of each capacitive sensor 200 and may convert the capacitance values into respective analog direct current (dc) voltages that are read and converted into digital values with an analog-to-digital converter (ADC) (not shown) and sent to the digital processor 306. Various methods of measuring capacitance change may be used. For example, but not limited to, capacitance measurement using: a charge time measurement unit (CTMU), see Microchip Application Note AN1250; a capacitive sensing module (CSM), see Microchip TB3064 "mTouch™ Projected Capacitive Touch Screen Sensing Theory of Operation"; a capacitive voltage divider (CVD) measurement, see Microchip Application Note AN1298; wherein all are hereby incorporated by reference herein and available at www.microchip.com.

Figure 4:
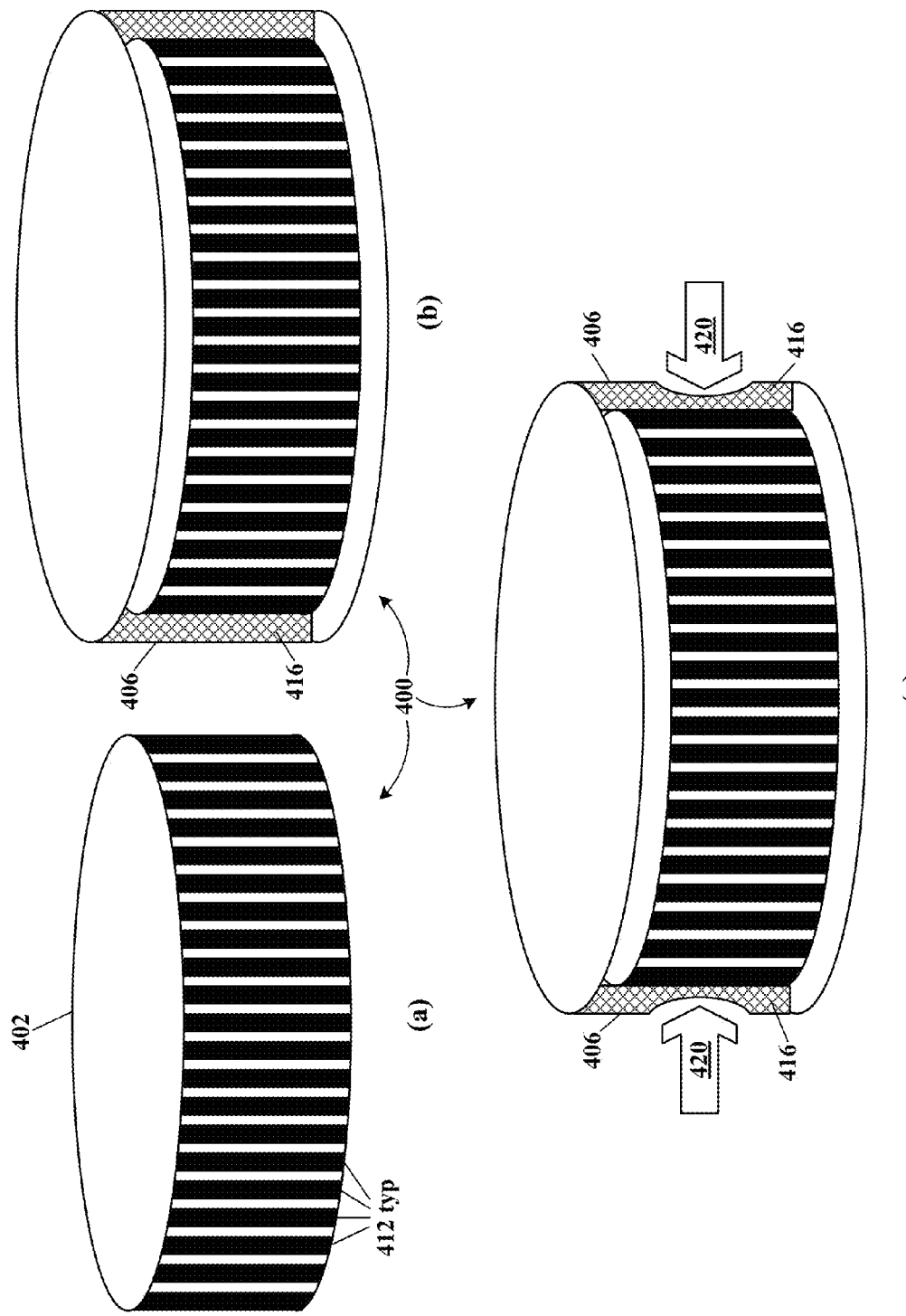
FIG. 4 illustrates schematic isometric cross section elevational views of a plurality of capacitive touch sensors arranged as a circular knob assembly, according to a specific example embodiment of this disclosure.

Referring to FIG. 4, depicted are schematic isometric cross section elevational views of a plurality of capacitive touch sensors arranged as a circular knob assembly, according to a specific example embodiment of this disclosure. A knob assembly, generally represented by the numeral 400, may comprise a curved substrate 402, a plurality of capacitive sensor elements 412, a physically deformable electrically insulated space 416, and an electrically conductive and mechanically deformable curved plane 406. The plurality of capacitive sensor elements 412 are disposed on the curved substrate 402. It is contemplated and within the scope of this disclosure that the plurality of capacitive sensor elements 412 may be disposed on either side of the curved substrate 402. The physically deformable electrically insulated space 416 surrounds the plurality of capacitive sensor elements 412 and the curved substrate 402. The electrically conductive and mechanically deformable curved plane 406 surrounds the physically deformable electrically insulated space 416 and the plurality of capacitive sensor elements 412.

When at least one mechanical force 420 is applied to at least one portion of the electrically conductive and mechanically deformable curved plane 406, that at least one portion thereof will move closer to at least one capacitive sensor element 412 proximate thereto, thereby changing (e.g., increasing) the capacitance valve of that at least one capacitive sensor element 412. The change in capacitance value(s) of the at least one capacitive sensor element 412 may be detected by the digital device 302 (FIG. 3) which may thereby determine a location(s) and direction of the force(s) 420. The force(s) 420 may be fingers 110 of a user's hand grasping the electrically conductive and mechanically deformable curved plane 406 and rotating around the circumference thereof to activate a control operation therefrom. The electrically conductive and mechanically deformable curved plane 406 and/or the physically deformable electrically insulated space 416 may remain stationary with or may rotate around the curved substrate 402 during a rotational movement of the user's fingers 110 grasping the electrically conductive and mechanically deformable curved plane 406.

Figure 5:
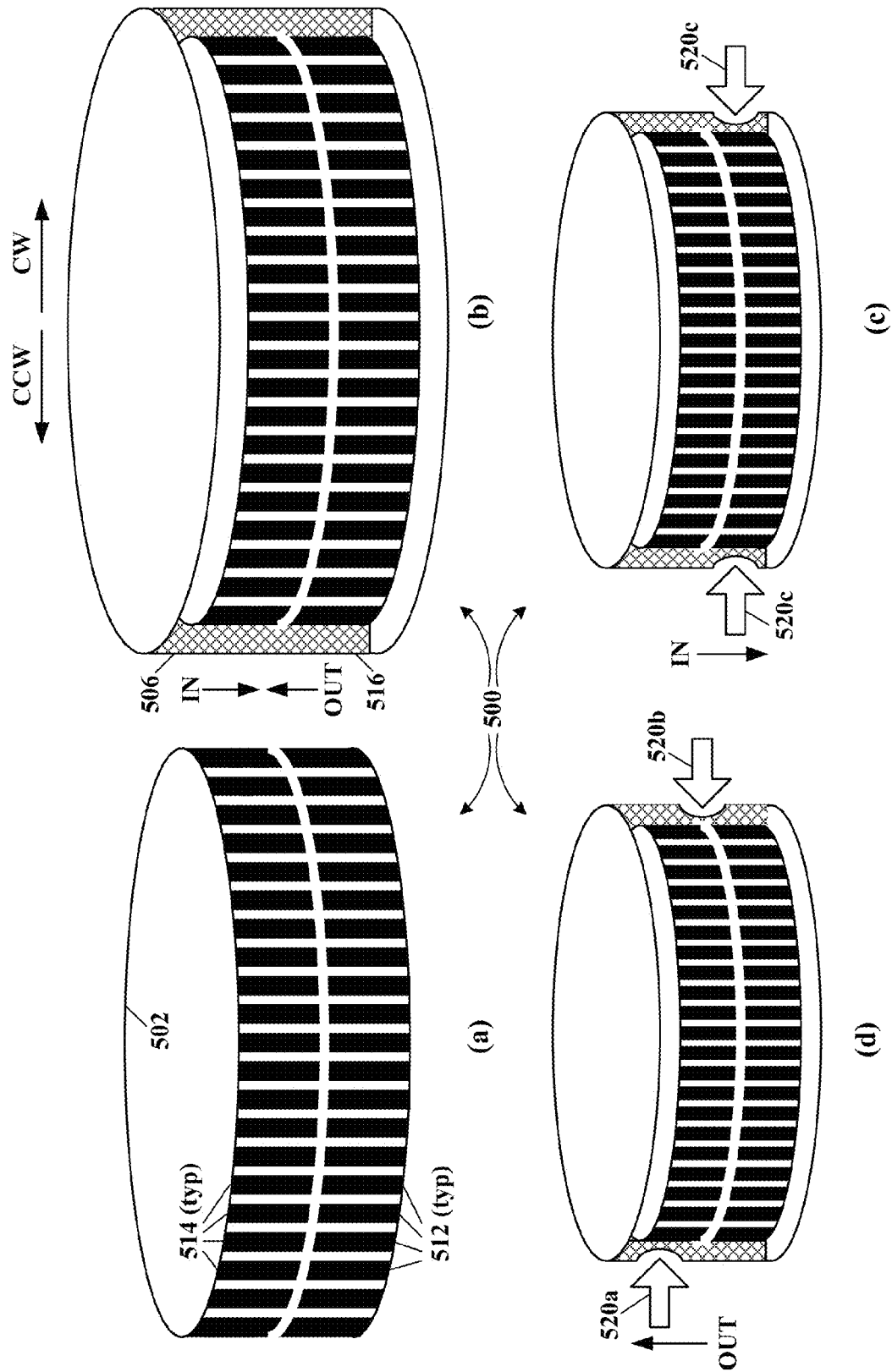
FIG. 5 illustrates schematic isometric cross section elevational views of a plurality of capacitive touch sensors arranged as a circular knob assembly, according to another specific example embodiment of this disclosure.

Referring to FIG. 5, depicted are schematic isometric cross section elevational views of a plurality of capacitive touch sensors arranged as a circular knob assembly, according to another specific example embodiment of this disclosure. A knob assembly, generally represented by the numeral 500, may comprise a curved substrate 502, a first plurality of capacitive sensor elements 512, a second plurality of capacitive sensor elements 514, a physically deformable electrically insulated space 516, and an electrically conductive and mechanically deformable curved plane 506. The first and second plurality of capacitive sensor elements 512 and 514 are disposed on the curved substrate 502. It is contemplated and within the scope of this disclosure that the first and second plurality of capacitive sensor elements 512 and 514 may be disposed on either side of the curved substrate 502. The physically deformable electrically insulated space 516 surrounds the first and second plurality of capacitive sensor elements 512 and 514, and the curved substrate 502. The electrically conductive and mechanically deformable curved plane 506 surrounds the physically deformable electrically insulated space 516, and the first and second plurality of capacitive sensor elements 512 and 514. It is also contemplated and within the scope of this disclosure that that more than two rows of capacitive sensor elements may be disposed on the curved substrate 502, e.g., third, fourth, fifth, etc., plurality of capacitive sensor elements.

When at least one mechanical force 520 is applied to at least one portion of the electrically conductive and mechanically deformable curved plane 506, that at least one portion thereof will move closer to at least one capacitive sensor element(s) 512 and/or 514 proximate thereto, thereby changing (e.g., increasing) the capacitance valve(s) of that at least one capacitive sensor element 512 and/or 514. The change in capacitance value(s) of the at least one capacitive sensor element 512 and/or 514 may be detected by the digital device 302 (FIG. 3) which may thereby determine a location(s) and direction(s) of the force(s) 520. The force(s) 520 may be fingers 110 of a user's hand grasping the electrically conductive and mechanically deformable curved plane 506 and rotating around and/or up or down the circumference thereof to activate a control operation(s) therefrom. The electrically conductive and mechanically deformable curved plane 506 and/or the physically deformable electrically insulated space 516 may remain stationary with or may rotate around and/or up or down the curved substrate 502 during a rotational and/or up or down movement of the user's fingers 110 grasping the electrically conductive and mechanically deformable curved plane 506. Force 520*a* will change the capacitance value(s) of the capacitive sensor element(s) 514, force 520*b* will change the capacitance values of capacitive sensor elements 512 and 514, and force 520*c* will change the capacitance value(s) of the capacitive sensor element(s) 512.

Referring to FIG. 6, depicted are schematic isometric cross section elevational and top views of a plurality of capacitive touch sensors arranged as a circular knob assembly, according to yet another specific example embodiment of this disclosure. A knob assembly, generally represented by the numeral 600, may comprise a curved substrate 602, a plurality of capacitive sensor elements 612, an electrically insulated space 616, an electrically conductive target 628, and an electrically conductive curved plane 626. The plurality of capacitive sensor elements 612 are disposed on the curved substrate 602. It is contemplated and within the scope of this disclosure that the plurality of capacitive sensor elements 612 may be disposed on either side of the curved substrate 602. The electrically insulated space 616 surrounds the plurality of capacitive sensor elements 612 and the curved substrate 602. The target 628 may be mechanically and electrically coupled to the conductive curved plane 626. The conductive curved plane 626 surrounds the electrically insulated space 616 and the plurality of capacitive sensor elements 612. The conductive curved plane 626 and the target 628, mechanically coupled thereto, rotate around the curved substrate 602 and the plurality of capacitive sensor elements 612. Optionally, a location post 630 may be provided for maintaining the mechanical positions between the conductive curved plane 626 and the curved substrate 602 while the conductive curved plane 626 rotates around the curved substrate 602. The electrically insulated space 616 may be air and/or a deformable electrically insulating material.

As the conductive curved plane 626 rotates, the target 628 moves around the curved substrate 602 and when proximate to at least one capacitive sensor element 612 the capacitance value of that at least one capacitive sensor element 612 will change, e.g., increase in value. The change in capacitance value(s) of the at least one capacitive sensor element 612 may be detected by the digital device 302 (FIG. 3) which may thereby determine the sequential location(s) thereof and therefrom determine the direction of rotation of the target 628. The conductive curved plane 626 may rotate during a rotational movement of the user's fingers 110 grasping the electrically conductive and mechanically deformable curved plane 606, or by any other means of rotation thereof.

Referring to FIG. 7, depicted are schematic isometric cross section elevational and top views of a plurality of capacitive touch sensors arranged as a circular knob assembly, according to still another specific example embodiment of this disclosure; A knob assembly, generally represented by the numeral 700, may comprise a curved substrate 702, a first plurality of capacitive sensor elements 712, a second plurality of capacitive sensor elements 714, an electrically insulated space 716, an electrically conductive target 728, and an electrically conductive curved plane 726. The first and second plurality of capacitive sensor elements 712 and 714 are disposed on the curved substrate 702. It is contemplated and within the scope of this disclosure that the first and second plurality of capacitive sensor elements 712 and 714 may be disposed on either side of the curved substrate 702. The electrically insulated space 716 surrounds the first and second plurality of capacitive sensor elements 712 and 714, and the curved substrate 702. The target 728 may be mechanically and electrically coupled to the conductive curved plane 726. The conductive curved plane 726 surrounds the electrically insulated space 716, and the first and second plurality of capacitive sensor elements 712 and 714. It is also contemplated and within the scope of this disclosure that that more than two rows of capacitive sensor elements may be disposed on the curved substrate 702, e.g., third, fourth, fifth, etc., plurality of capacitive sensor elements.

The conductive curved plane 726 and the target 728, mechanically coupled thereto, rotate around, and/or up or down the curved substrate 702 and the plurality of first and second capacitive sensor elements 712 and 714. Optionally, a location post 730 may be provided for maintaining the mechanical positions between the conductive curved plane 726 and the curved substrate 702 while the conductive curved plane 726 rotates around the curved substrate 702. The electrically insulated space 716 may be air and/or a deformable electrically insulating material.

As the conductive curved plane 726 rotates, the target 728 moves around the curved substrate 702 and when proximate to at least one of the first and/or second capacitive sensor element(s) 712 and/or 714 the capacitance value(s) of that at least one first and/or second capacitive sensor element(s) 712 and/or 714 will change, e.g., increase in value. The change in capacitance value(s) of the at least one first and/or second capacitive sensor element(s) 712 and/or 714 may be detected by the digital device 302 (FIG. 3) which may thereby determine the sequential location(s) thereof and therefrom determine the direction(s) of rotation, and/or in or out motion of the target 728. The conductive curved plane 726 may rotate, and/or move in or out during a rotational motion(s), and/or in or out motion(s) of the user's fingers 110 grasping the electrically conductive and mechanically deformable curved plane 706, or by any other means of rotating, and/or in or out motion(s) of the electrically conductive and mechanically deformable curved plane 706.

Figure 8:
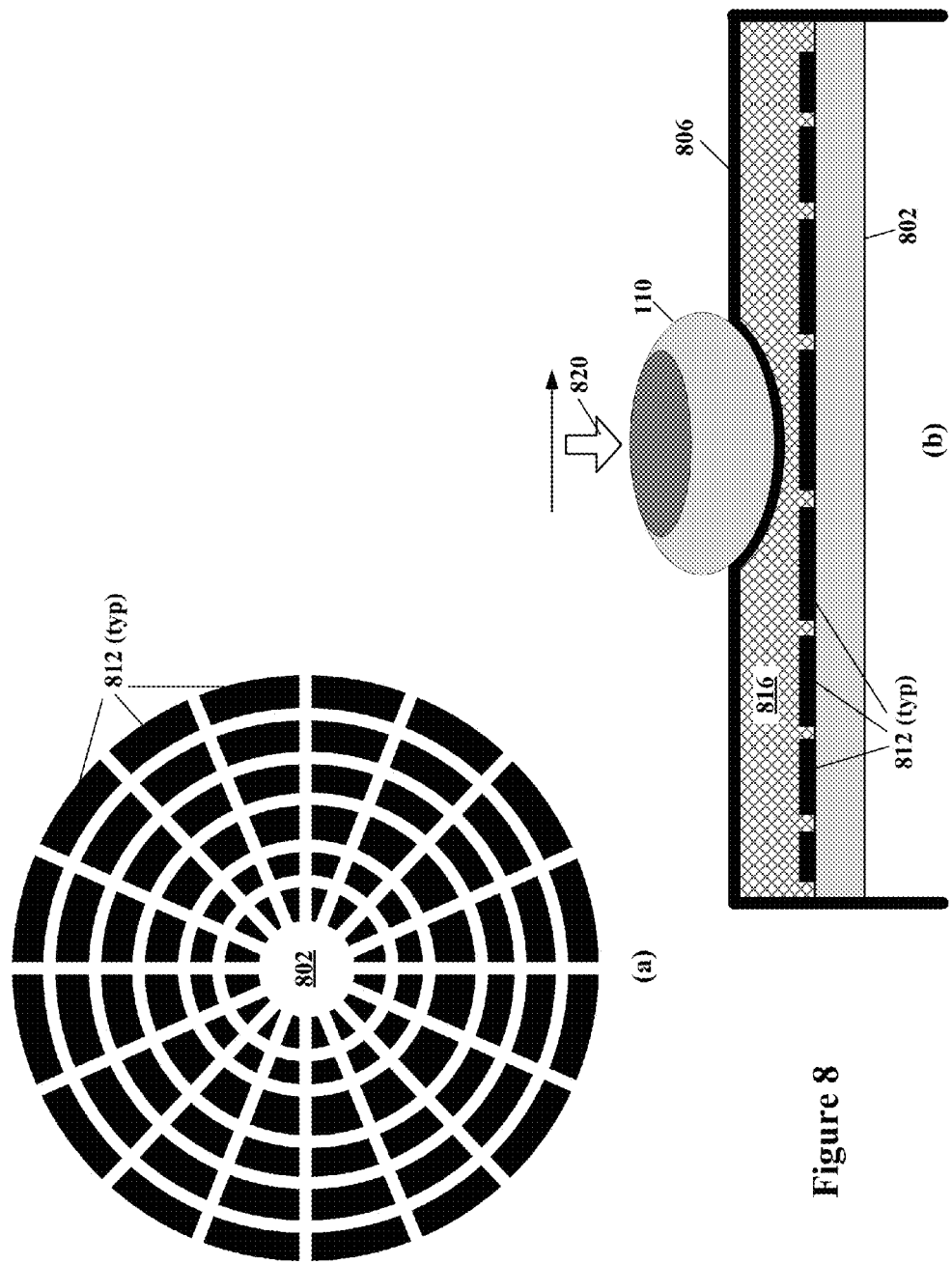
FIG. 8 illustrates schematic cross section elevational and top views of a plurality of capacitive touch sensors arranged on a top surface of a circular knob, according to specific example embodiments of this disclosure.

Referring to FIG. 8, depicted are schematic cross section elevational and top views of a plurality of capacitive touch sensors arranged on a top surface of a circular knob, according to specific example embodiments of this disclosure. A circular knob, e.g., any of the embodiments disclosed herein, may have a plurality of capacitive sensor elements 812 disposed on a circular substrate 802, a physically deformable electrically insulated space 816, and an electrically conductive deformable plane 806 on a top surface of a circular portion of the conductive deformable plane 806. The physically deformable electrically insulated space 816 is over the plurality of capacitive sensor elements 812 and the circular substrate 802. The conductive deformable plane 806 may surround the physically deformable electrically insulated space 816.

When at least one mechanical force 820 is applied to at least one portion of the conductive deformable plane 806 that at least one portion thereof will move closer to at least one capacitive sensor element 812 proximate thereto, thereby changing (e.g., increasing) the capacitance valve of that at least one capacitive sensor element 812. The change in capacitance value(s) of the at least one capacitive sensor element(s) 812 may be detected by the digital device 302

(FIG. 3) which may thereby determine a location(s) and direction(s) of the at least one force 820. The force(s) 820 may be a finger(s) 110 of a user's hand pushing down on the top surface of the conductive deformable plane 806 to activate a control operation therefrom. Gesturing with two fingers spreading apart may represent a positive zoom, and gesturing with two fingers moving together may represent a negative zoom. One finger moving in a direction may represent movement of a mouse pointer, and a finger tap may represent an enter command.

Figure 9:
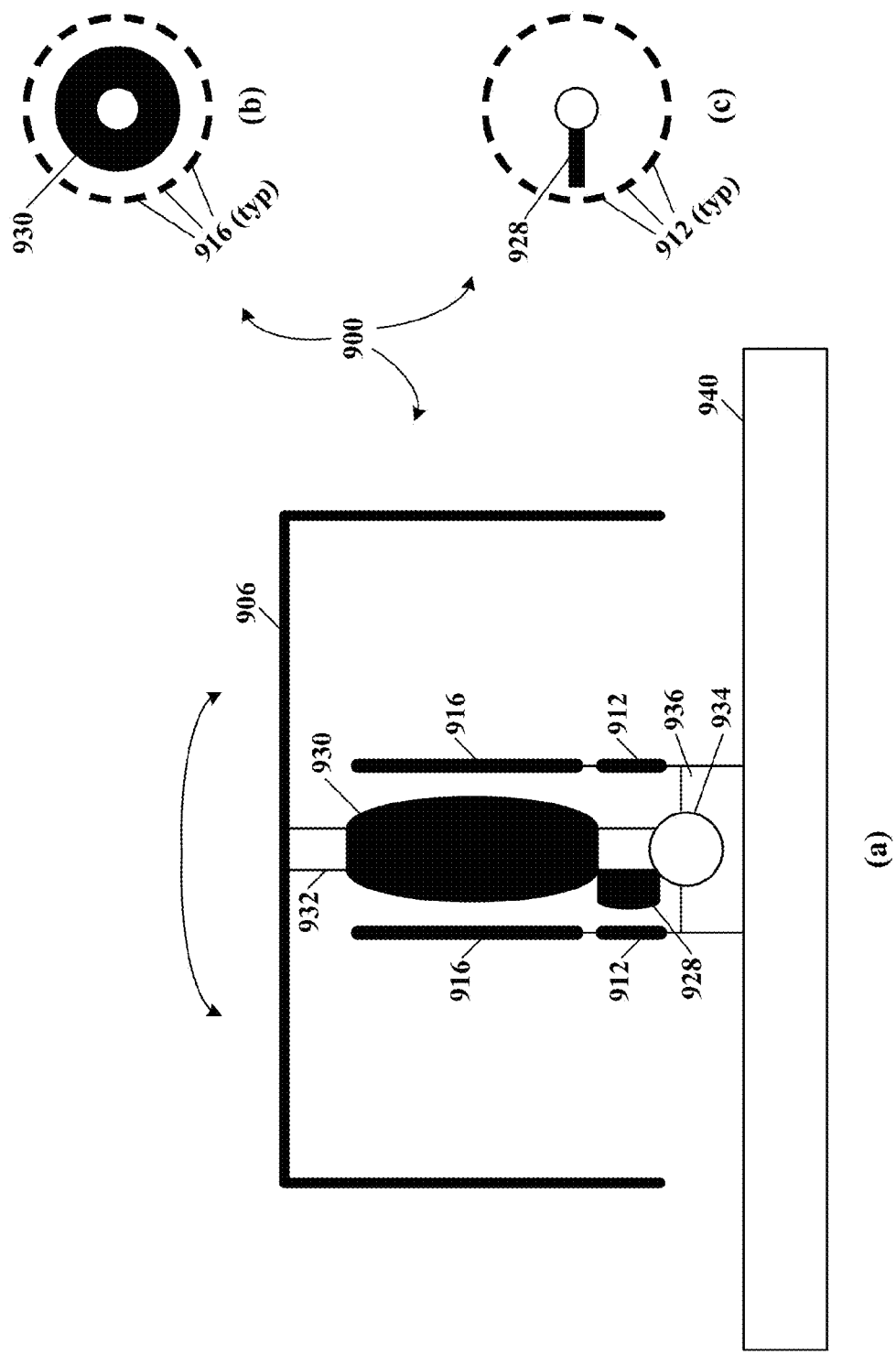
FIG. 9 illustrates schematic cross section elevational, top and bottom views of a plurality of capacitive touch sensors arranged as a circular knob assembly having multiple axes of linear movement and rotation, according to still another specific example embodiment of this disclosure.

Referring to FIG. 9, depicted are schematic cross section elevational, top and bottom views of a plurality of capacitive touch sensors arranged as a circular knob assembly having multiple axes of linear movement and rotation, according to still another specific example embodiment of this disclosure. A knob assembly, generally represented by the numeral 900, may comprise a first plurality of capacitive sensor elements 912 arranged in a circle (FIG. 9(c)), a second plurality of capacitive sensor elements 916 arranged in a circle (FIG. 9(b)), a knob 906 attached to a first end of a shaft 932, a first target 928 attached to the shaft 932, a second target 930 above the first target 928 and also attached to the shaft 932, a pivot means 934, e.g., ball, semi-flexible coupling, etc.; attached to a second end of the shaft 932, a socket 936 adapted to receive the pivot means 934, and a base 940 attached to the socket 936. Wherein the combination of the pivot means 934 and the socket 936 allow the knob 906 to rotate and/or tilt linearly in substantially all directions. The pivot means 934 and the socket 936 may also be adapted to position the shaft 932 substantially perpendicular to the plane of the base 940 when there is no force being applied to the knob 906.

When the shaft 932 is substantially perpendicular to the plane of the base 940 the second target 930 is substantially equidistant between the second plurality of capacitive sensor elements 916 and the capacitive values thereof may also be substantially the same if each of the second plurality of capacitive sensor elements 916 has substantially the same area as the other ones of the second plurality of capacitive sensor elements 916. When the knob 906 is tilted in a direction caused by a force, e.g., from a user's finger(s) 110 or palm of the user's hand, the second target 930 will be biased toward at least one of the second capacitive sensor elements 916 and away from at least one other of the other second capacitive sensor elements 916 located at substantially 180 degrees opposite thereof. This will cause the capacitance value of the second capacitive sensor element(s) 916 closer to the second target 930 to increase and the capacitance value of the other second capacitive sensor element(s) 916 farther from the second target 930 to decrease.

The first plurality of capacitive sensor elements 912 in combination with the first target 928 may be used in determining rotation position of the knob 906, see FIG. 9(c). The first capacitive sensor element 912 closest to the first target 928 will have a capacitance value change (increase) that is different from the other ones of the first capacitive sensor elements 912, whereby the knob 906 rotational position may thereby be determined. Any change in capacitance value(s) of the first or second capacitive sensor elements 512 or 516 may be detected by the digital device 302 (FIG. 3) which may thereby determine the rotational location and/or tilt direction caused by the force(s) applied to the knob 906.

Figure 10:
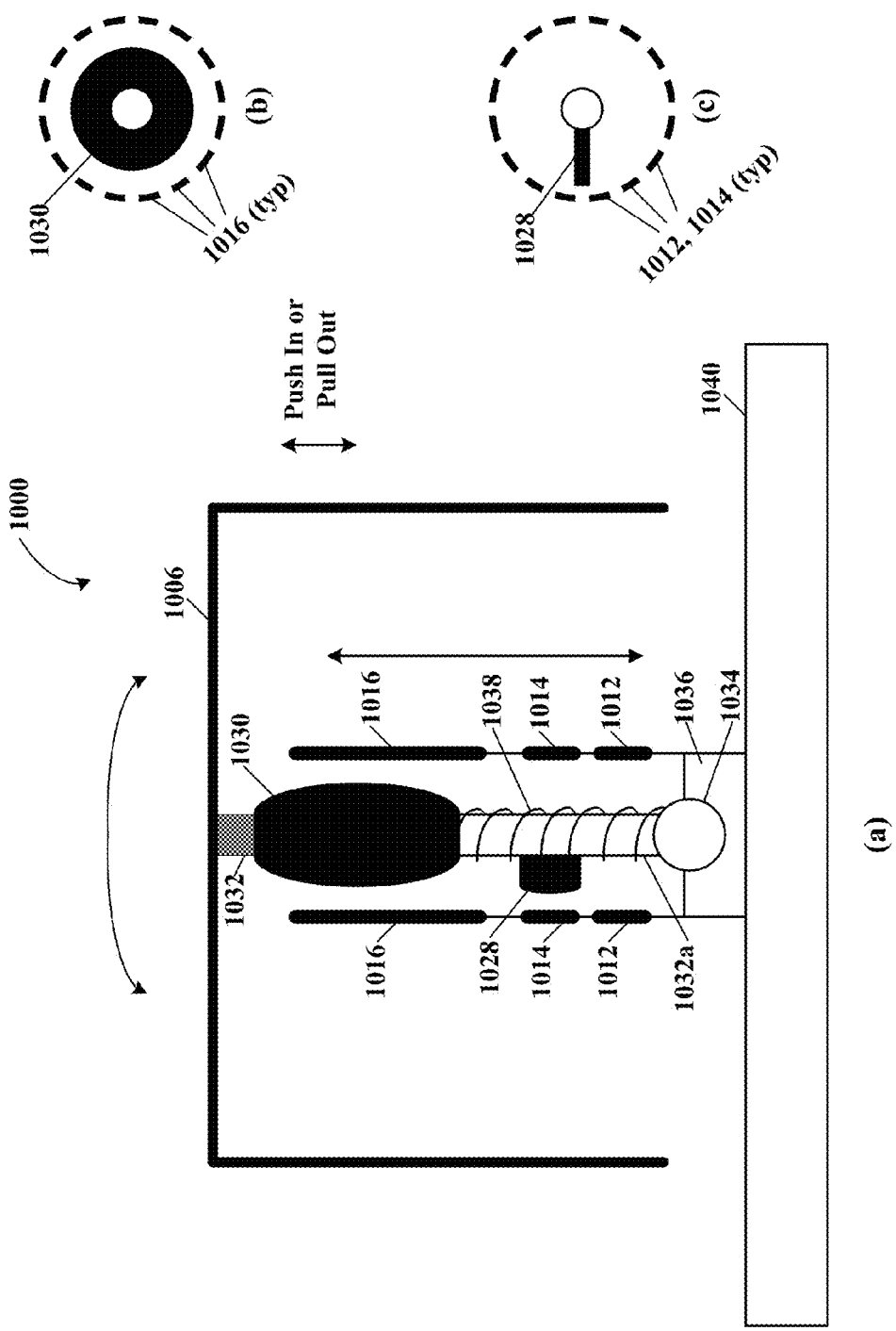
FIG. 10 illustrates schematic cross section elevational, top and bottom views of a plurality of capacitive touch sensors arranged as a circular knob assembly having multiple axes of linear movement and rotation, according to another specific example embodiment of this disclosure.

Referring to FIG. 10, depicted are schematic cross section elevational, top and bottom views of a plurality of capacitive touch sensors arranged as a circular knob assembly having multiple axes of linear movement and rotation, according to another specific example embodiment of this disclosure. A knob assembly, generally represented by the numeral 1000, may comprise a first plurality of capacitive sensor elements 1012 arranged in a circle (FIG. 10(c)), a second plurality of capacitive sensor elements 1014 above the first plurality of capacitive sensor elements 1012 and also arranged in a circle (FIG. 10(c)), a third plurality of capacitive sensor elements 1016 arranged in a circle (FIG. 10(b)), a knob 1006 attached to a first end of a shaft 1032, a first target 1028 attached to the shaft 1032, a second target 1030 above the first target 1028 and also attached to the shaft 1032, a pivot means 1034, e.g., ball, semi-flexible coupling, etc.; attached to a second end of a shaft 1032a, a socket 1036 adapted to receive the pivot means 1034, a means for positioning 1038, e.g., spring, elastic foam (not shown), etc., for biasing the position of the knob 1006 as shown in FIG. 10(a); and a base 1040 attached to the socket 1036. Wherein the combination of the pivot means 1034, the socket 1036 and the positioning means 1038 allow the knob 1006 to rotate and/or tilt linearly in substantially all directions, and/or move in or out. The pivot means 1034 and the socket 1036 may also be adapted to position the shaft 1032 substantially perpendicular to the plane of the base 1040 when there is no force being applied to the knob 1006.

When the shaft 1032 is substantially perpendicular to the plane of the base 1040 the second target 1030 is substantially equidistant between the third plurality of capacitive sensor elements 1016 and the capacitive values thereof may also be substantially the same if each of the third plurality of capacitive sensor elements 1016 has substantially the same area as the other ones of the third plurality of capacitive sensor elements 1016. When the knob 1006 is tilted in a direction caused by a force, e.g., from a user's finger(s) 110 or palm of the user's hand, the second target 1030 will be biased toward at least one of the third capacitive sensor elements 1016 and away from at least one other of the other third capacitive sensor elements 1016 located at substantially 180 degrees opposite thereof. This will cause the capacitance value of the third capacitive sensor element(s) 1016 closer to the second target 1030 to increase and the capacitance value of the other third capacitive sensor element(s) 1016 farther from the second target 1030 to decrease.

The first and second plurality of capacitive sensor elements 1012 and 1014 in combination with the first target 1028 may be used in determining rotation, and/or in/out position(s) of the knob 1006, see FIG. 10(c). The first capacitive sensor element 1012 closest to the first target 1028 will have a capacitance value change (increase) different from the other ones of the first plurality of capacitive sensor elements 1012 when the knob 1006 is pushed to an in position and, likewise, the second plurality of capacitive sensor elements 1014 when the knob 1006 is in an out position, whereby the knob 1006 rotational position may thereby be determined. The capacitance values of the first and second capacitive sensors 1012 and 1014, e.g., ratiometric changes in the capacitance values thereof, proximate to the target 1028 may also be used in determining vertical (in/out) position of the knob 1006. Any change in capacitance value(s) of the first, second and/or third capacitive sensor elements 1012, 1014, 1016 may be detected by the digital device 302 (FIG. 3) which may thereby determine the rotational location, tilt direction, and in/out position caused by the force(s) applied to the knob 1006.

Figure 11:
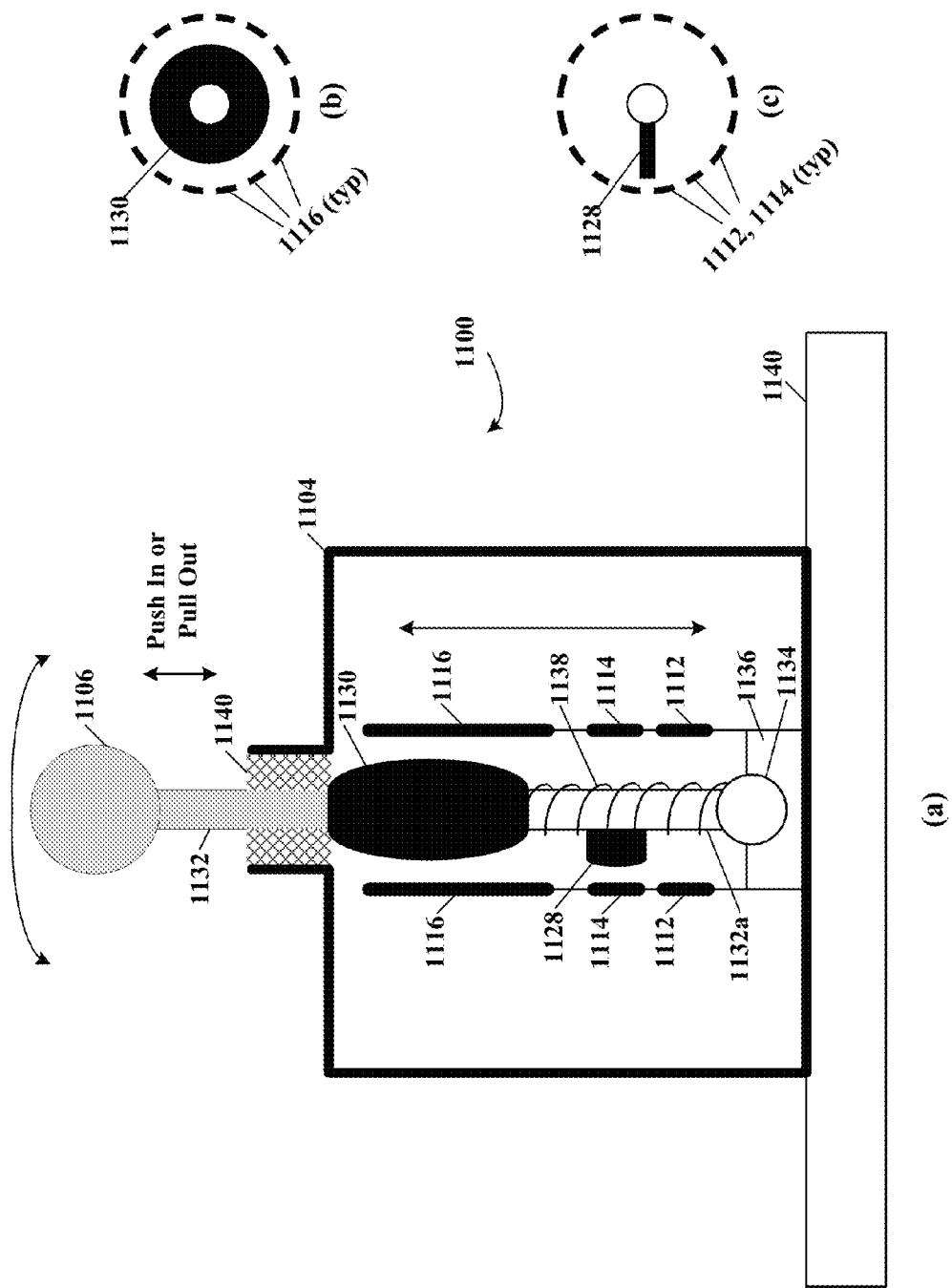
FIG. 11 illustrates schematic cross section elevational, top and bottom views of a plurality of capacitive touch sensors arranged as a control lever assembly having multiple axes of linear movement and rotation, according to still another specific example embodiment of this disclosure.

Referring to FIG. 11, depicted are schematic cross section elevational, top and bottom views of a plurality of capacitive touch sensors arranged as a control lever assembly having multiple axes of linear movement and rotation, according to still another specific example embodiment of this disclosure. A control lever assembly, generally represented by the numeral 1100, may comprise a first plurality of capacitive sensor elements 1112 arranged in a circle (FIG. 11(*c*)), a second plurality of capacitive sensor elements 1114 above the first plurality of capacitive sensor elements 1112 and also arranged in a circle (FIG. 11(*c*)), a third plurality of capacitive sensor elements 1116 arranged in a circle (FIG. 11(*b*)), a control lever 1106, e.g., "joy stick," attached to a first end of a shaft 1132, a first target 1128 attached to the shaft 1132, a second target 1130 above the first target 1128 and also attached to the shaft 1132, a pivot means 1134, e.g., ball, semi-flexible coupling, etc.; attached to a second end of a shaft 1132*a,* a socket 1136 adapted to receive the pivot means 1134, a means for positioning 1138, 1140, e.g., spring, elastic foam, etc., for biasing the position of the control lever 1106 as shown in FIG. 11(*a*); and a base 1140 attached to the socket 1136. Wherein the combination of the pivot means 1134, the socket 1136 and the positioning means 1138, 1140 allow the control lever 1106 to rotate and/or tilt linearly in substantially all directions, and/or move in or out. The pivot means 1134 and the socket 1136 may also be adapted to position the shaft 1132 substantially perpendicular to the plane of the base 1140 when there is no force being applied to the control lever 1106.

When the shaft 1132 is substantially perpendicular to the plane of the base 1140 the second target 1130 is substantially equidistant between the third plurality of capacitive sensor elements 1116 and the capacitive values thereof may also be substantially the same if each of the third plurality of capacitive sensor elements 1116 has substantially the same area as the other ones of the third plurality of capacitive sensor elements 1116. When the control lever 1106 is tilted in a direction caused by a force, e.g., from a user's finger(s) 110 or palm of the user's hand, the second target 1130 will be biased toward at least one of the third capacitive sensor elements 1116 and away from at least one other of the other third capacitive sensor elements 1116 located at substantially 180 degrees opposite thereof. This will cause the capacitance value of the third capacitive sensor element(s) 1116 closer to the second target 1130 to increase and the capacitance value of the other third capacitive sensor element(s) 1116 farther from the second target 1130 to decrease.

The first and second plurality of capacitive sensor elements 1112 and 1114 in combination with the first target 1128 may be used in determining rotation, and/or in/out position(s) of the control lever 1106, see FIG. 11(*c*). The first capacitive sensor element 1112 closest to the first target 1128 will have a capacitance value change (increase) different from the other ones of the first plurality of capacitive sensor elements 1112 when the control lever 1106 is pushed to an in position and, likewise, the second plurality of capacitive sensor elements 1114 when the control lever 1106 is in an out position whereby the control lever rotational position may thereby be determined. The capacitance values of the first and second capacitive sensors 1112 and 1114, e.g., ratiometric changes in the capacitance values thereof, proximate to the target 1128 may also be used in determining vertical (in/out) position of the control lever 1106. Any change in capacitance value(s) of the first, second and/or third capacitive sensor elements 1112, 1114, 1116 may be detected by the digital device 302 (FIG. 3) which may thereby determine the rotational location, tilt direction, and in/out position caused by the force(s) applied to the control lever 1106.

Figure 12:
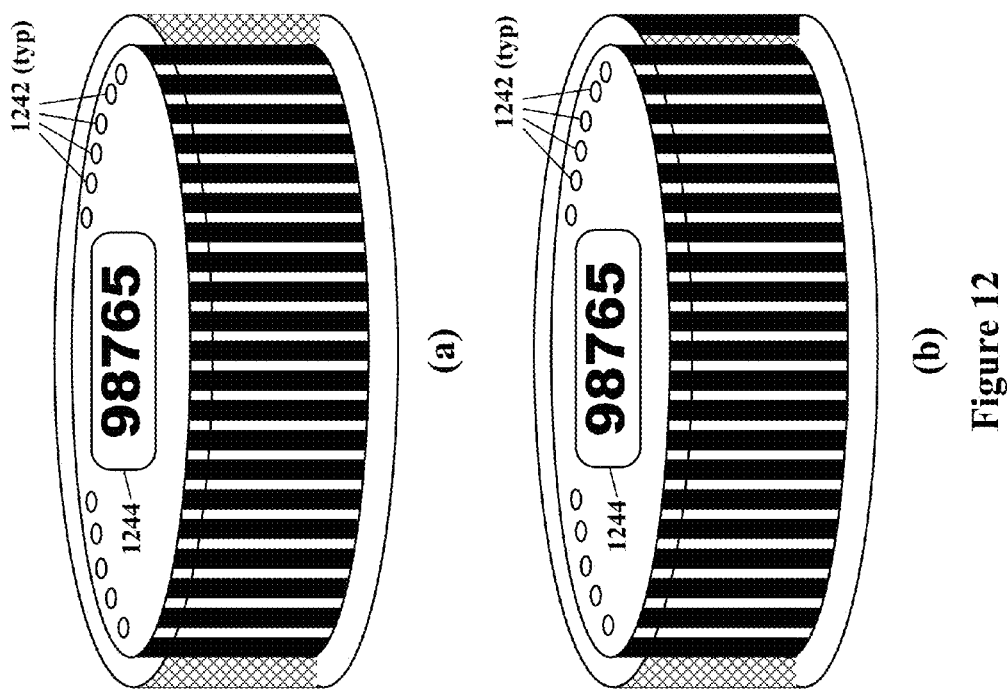
FIG. 12 illustrates schematic isometric elevational views of visual displays embedded in top portions of circular knobs, according to specific example embodiments of this disclosure.

Referring to FIG. 12, depicted are schematic isometric elevational views of visual displays embedded in top portions of circular knobs, according to specific example embodiments of this disclosure. Light emitting diodes 1242 may be embedded into or on the top portion of the knob and may be arranged in a circular pattern to indicate rotational position of the knob. A visual display 1244, e.g., alphanumeric LED, LCD, etc.; may be embedded into or on the top portion of the knob and provide information to the user.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A gesturing apparatus, comprising:
a base;
a ball rotationally attached to the base;
a shaft having a first end coupled to the ball;
a first target attached at a location of the shaft toward the first end thereof;
a second target attached to and is disposed around the shaft toward a second end thereof;
a first plurality of capacitive sensor elements disposed around the shaft toward to the first end thereof, wherein the first target varies a capacitance of at least one of the capacitive sensors of the first plurality of capacitive sensors depending on a distance between the first target and the at least one of the capacitive sensors; and
a second plurality of capacitive sensor elements disposed around the shaft toward to the second end thereof, wherein the second target varies capacitances of the second plurality of capacitive sensors depending on a distance between the second target and respective capacitive sensors of the second plurality of capacitive sensors,
wherein when the shaft is rotated substantially perpendicular to the base, the first target is proximate to at least one of the first plurality of capacitive sensor elements, wherein the at least one of the first plurality of capacitive sensor elements changes capacitance value that is used in determining rotation position of the shaft, and
wherein when the shaft is tilted away from being substantially perpendicular to the base, the second target is closer to at least one of the second plurality of capacitive sensor elements, wherein the at least one of the second plurality of capacitive sensor elements changes capacitance value that is used in determining tilt position of the shaft;
a third plurality of capacitive sensor elements disposed around the shaft and located between the first and second plurality of capacitive sensor elements; an elastic foam allows motion of the shaft toward or away from the base, wherein the first target is proximate to the third plurality of capacitive sensor elements, wherein the third plurality of capacitive sensor elements changes capacitance value that is used in determining rotation position of the shaft and position toward or away from the base; a knob attached to the second end of the shaft; a control stick attached to the second end of the shaft; a biasing element for biasing the shaft into a perpendicular position, wherein the biasing element is a spring, wherein the knob can be pushed against a force applied by the spring, wherein the control stick can be pushed against a force applied by the spring, wherein ratiometric changes of the capacitance of the first and third capacitive sensor elements determine a vertical position of the first target; a digital processor coupled with the plurality of capacitive sensor elements, wherein the digital processor embedded in a microcontroller comprising an analog front end coupled with the capacitive sensor elements, and wherein the analog front end comprises a capacitance measurement circuit generating a voltage proportional to a measured capacitance, wherein the capacitive measurement unit comprising a capacitive voltage divider.

2. The gesturing apparatus according to claim 1, wherein the analog front end comprises a charge time measurement unit (CTMU) circuit.

3. The gesturing apparatus according to claim 1, wherein the analog front end comprises a capacitive sensing module (CSM) circuit.

* * * * *